United States Patent
Kollakowski et al.

(10) Patent No.: US 8,473,256 B2
(45) Date of Patent: Jun. 25, 2013

(54) SYSTEM AND METHOD FOR PROVIDING A DIGITAL THREE-DIMENSIONAL DATA MODEL

(75) Inventors: Malte Kollakowski, Hamburg (DE);
Christian Gruetzmann, Reinfeld (DE);
Thorsten Wienberg, Bremen (DE);
Sebastian Hebenbrock, Bremen (DE)

(73) Assignee: Airbus Operations GmbH, Hamburg (DE)

( * ) Notice: Subject to any disclaimer, the term of this patent is extended or adjusted under 35 U.S.C. 154(b) by 752 days.

(21) Appl. No.: 12/611,978

(22) Filed: Nov. 4, 2009

(65) Prior Publication Data
US 2010/0114539 A1 May 6, 2010

Related U.S. Application Data

(60) Provisional application No. 61/111,059, filed on Nov. 4, 2008.

(51) Int. Cl.
*G06F 17/50* (2006.01)

(52) U.S. Cl.
USPC .............................................................. 703/1

(58) Field of Classification Search
USPC ................... 703/1, 6; 700/97–98; 345/420
See application file for complete search history.

(56) References Cited

U.S. PATENT DOCUMENTS

| 7,493,239 B2 * | 2/2009 | Okada et al. ...................... 703/1 |
| 7,965,396 B2 * | 6/2011 | Ashford et al. ................ 356/620 |
| 2004/0257589 A1 * | 12/2004 | Warnemunde et al. ........ 356/602 |
| 2006/0167648 A1 * | 7/2006 | Ohtani .......................... 702/150 |

FOREIGN PATENT DOCUMENTS

| DE | 199 25 462 | 2/2001 |
| DE | 100 25 741 | 11/2001 |

OTHER PUBLICATIONS

Yilmaz et al. "Digital Photogrammetery in Obtaining of 3D Model Data of Irregular Small Objects"., Jul. 2008., The International Archives of the Photogrammetry, Remote sensing and Spatial Information Science., vol. XXXVII. Part B3b. p. 125-130.*
Chen et al. "Overview of three-dimensional shape measurement using optical methods"., Jan. 2000., 2000 Society of Photo-Optical Instrumentation Engineers. p. 10-22.*
Office action in related German application No. 10 2008 043 4450.

* cited by examiner

*Primary Examiner* — Eunhee Kim
(74) *Attorney, Agent, or Firm* — Greer, Burns & Crain Ltd.

(57) ABSTRACT

The present invention is directed to a method and a system for providing a digital three-dimensional data model of a component. Thereby, modifications which are accomplished on the component, for instance a cable, are being captured by means of photogrammetry for the creation of a digital three-dimensional modifications data model. The digital three-dimensional data model of the component is afterwards automatically updated as a function of the generated modifications data model.

15 Claims, 6 Drawing Sheets

SYSTEM AND METHOD FOR PROVIDING A DIGITAL THREE-DIMENSIONAL DATA MODEL

TECHNICAL BACKGROUND

The invention relates to a system and a method for providing a digital three-dimensional data model of a component, in particular of an aircraft component.

Aircraft comprise a multiplicity of components which are mounted in the aircraft fuselage in accordance with plans and construction documents. Examples of such components are pipelines or electrical lines that are laid in the aircraft fuselage of the aircraft. During the mounting of such components, it can happen that a fitter has to deviate from the specification of the construction document. By way of example, if when laying an electrical line the fitter ascertains that this electrical line crosses a pipeline or a support, the electrical line has to be laid around the already laid pipeline or the support and thus deviates from the original laying specification. This change process leads to a change notification DQN (Design Query Note), which is incorporated into a digital three-dimensional model of the object.

FIG. 1 shows the conventional procedure for providing a digital three-dimensional data model in the case of a component, in particular in the case of an aircraft component.

A digital three-dimensional model of an object, for example of an aircraft, is stored in a database, said model also being referred to as DMU (Digital Mock Up). From this digital model, two-dimensional construction documents are derived, for example views of the component to be laid on paper for the respective fitter. On the basis of these construction documents, which, besides technical drawings, can also contain textual explanations and instructions, a fitter lays a line within the aircraft fuselage, by way of example. If the fitter, when carrying out the line laying, has to deviate from the construction document of the object or the desired specification, an alteration notification DQN is generated in order to document the change made. This change notification or complaint notification BM is created manually and passed to the development department or the Design Office (DO), which examines the change proposal or solution proposal made by the employee or fitter. The complaint notification BM or the change proposal DQN can also contain photographs of the change location in addition to changes in the technical drawings and textual observations or written indications. In this case, in some instances a large number of photographs are created when there are complex changes.

If the development engineers or technicians in the Design Office arrive at the opinion that the change proposal effectively eliminates the fault that has occurred, or the deviation, the change is incorporated into the existing three-dimensional digital model. In the case of a complaint notification BM, the development engineers themselves design changes and incorporate them into the three-dimensional model, as illustrated in FIG. 1. Two-dimensional construction documents can then once again be derived from the changed three-dimensional model.

The conventional procedure illustrated in FIG. 1 has some considerable disadvantages, however. The change proposals DQN created on site, for example during the mounting of a line, have a two-dimensional data format and are object-related. The incorporation of further design solutions into the three-dimensional model and the derivation of the construction documents, in particular of the drawings, are performed at a later time by the Design Office, or by the development department. Within this time period, the actual component state or mounting state is at a further-developed stage than the defined desired state of the three-dimensional data model. This entails various risks. The obsolete DMU or the no longer up-to-date three-dimensional model of the object and the no longer up-to-date set of construction documents derived therefrom make it more difficult to assess and rectify further technical complaints, since already existing change proposals or complaint notifications that have not yet been incorporated have to be taken into account for a correct assessment with regard to the procedure for further necessary changes that have occurred.

A further disadvantage of the conventional procedure illustrated in FIG. 1 is that a media break occurs between the two-dimensional correction proposals or change notifications and the three-dimensional data model of the respective object. The change notifications or complaint notifications created on site, which in some instances also contain photographs, have to be incorporated manually into the three-dimensional data model by a technician after examination. If an error occurs during inputting or incorporation, this input error or this erroneous correction of the data model can in turn generate further errors that are possibly identified at a later time during mounting and, for their part, lead to new change notifications or complaint notifications. Consequently, the manual inputting of the necessary changes into the three-dimensional model is not only time-consuming but in turn susceptible to errors.

A further disadvantage of the conventional procedure illustrated in FIG. 1 is that upon the submission of complaint notifications BM or change proposals, which can in some instances contain a multiplicity of photographs, these can be interpreted only with difficulty by the technicians in the Design Office or development department, and so queries may become necessary.

Therefore, it is an object of the present invention to provide a system and a method for providing a digital three-dimensional data model of a component wherein necessary changes can be incorporated into the data model in a simple and reliable manner.

SUMMARY OF THE INVENTION

The invention provides a system for providing a digital three-dimensional data model of a component, wherein changes made to the component are detected by means of photogrammetry for the generation of digital three-dimensional change data models by which the digital three-dimensional data model of the component is automatically updated.

The system according to the invention affords the advantage that there is no media break between two-dimensional photographs and three-dimensional data models and, consequently, changes can be automatically updated and made without any errors.

In one embodiment of the system according to the invention, marking elements are provided at each change location of the component.

In one embodiment of the system according to the invention, at least one photographic camera is provided which photographically records the component provided with marking elements at the respective change location from different points of view in order to generate digital images.

Said photographic camera can be a conventional portable digital photographic camera which can be operated in a simple manner for the respective employee, for example the fitter, or a high-resolution calibratable photographic camera.

In one possible embodiment, the digital images generated by the photographic camera are transmitted to a computer via a radio interface.

In one possible embodiment of the system according to the invention, the marking elements have firstly measurement marks, which are fitted to the component, and secondly coding marks for linking the different digital images. Furthermore, the marking elements can comprise reference scales.

In one embodiment of the system according to the invention, a calculation unit is provided, which automatically detects the measurement marks provided on the component in the recorded digital images and calculates the spatial coordinates thereof.

In one embodiment of the system according to the invention, the calculation unit calculates a digital three-dimensional change data model at the respective change location of the component from the calculated spatial coordinates of the detected measurement marks.

In one embodiment of the system according to the invention, provision is made of a memory for storing a digital three-dimensional data model of the entire component.

In one embodiment of the system according to the invention, the calculation unit updates the stored digital three-dimensional data model of the entire component in a manner dependent on the generated change data models.

In one possible embodiment of the system according to the invention, the measurement marks are stuck onto the respective component.

In one possible embodiment of the system according to the invention, the relevant component is an aircraft component.

In one possible embodiment of the system according to the invention, the component is a pipeline or an electrical line.

The pipeline can be a hydraulic line, a gas line or a fuel line.

The invention furthermore provides a method for providing a digital three-dimensional data model of a component, wherein a change made to the component is detected by means of photogrammetry for the generation of a digital three-dimensional change data model by which the digital three-dimensional data model of the component is automatically updated.

In one embodiment of the method according to the invention, the component is provided with marking elements at each change location at which a change to the component is made.

In one embodiment of the method according to the invention, the component provided with marking elements is photographically recorded at the respective change location from different points of view in order to generate digital images.

In one embodiment of the method according to the invention, the marking elements have measurement marks, which are fitted to the component, and also coding marks for linking different digital images, and reference scales.

In one embodiment of the method according to the invention, the measurement marks fitted to the component are automatically extracted from the digital images and the spatial coordinates thereof are calculated.

In one embodiment of the method according to the invention, a digital three-dimensional change data model at the respective change location of the component is generated from the calculated spatial coordinates of the detected measurement marks.

In one embodiment of the method according to the invention, a stored digital three-dimensional data model of the entire component is automatically updated by the change data models generated for the change locations.

In one embodiment of the method according to the invention, the updated digital three-dimensional data model of the entire component is compared with a digital three-dimensional reference data model for the calculation of a model deviation.

In one embodiment of the method according to the invention, a fault handling measure is carried out if the model deviation lies outside a tolerance range that can be set.

In one embodiment of the method according to the invention, each generated three-dimensional change data model is stored together with the associated digital images for the documentation of the respective change.

The invention furthermore provides a computer program comprising program instructions for carrying out a method for providing a digital three-dimensional data model of a component, wherein a change made to the component is detected by means of photogrammetry for the generation of a digital three-dimensional change data model by which the digital three-dimensional data model of the component is automatically updated.

The invention furthermore provides a data carrier for storing a computer program comprising program instructions for carrying out a method for providing a digital three-dimensional data model of a component, wherein a change made to the component is detected by means of photogrammetry for the generation of a digital three-dimensional change data model by which the digital three-dimensional data model of the component is automatically updated.

Embodiments of the system according to the invention and of the method according to the invention for providing a digital three-dimensional data model of a component are described below with reference to the accompanying figures for elucidating essential features.

DETAILED DESCRIPTION OF EMBODIMENTS

Figure 2:
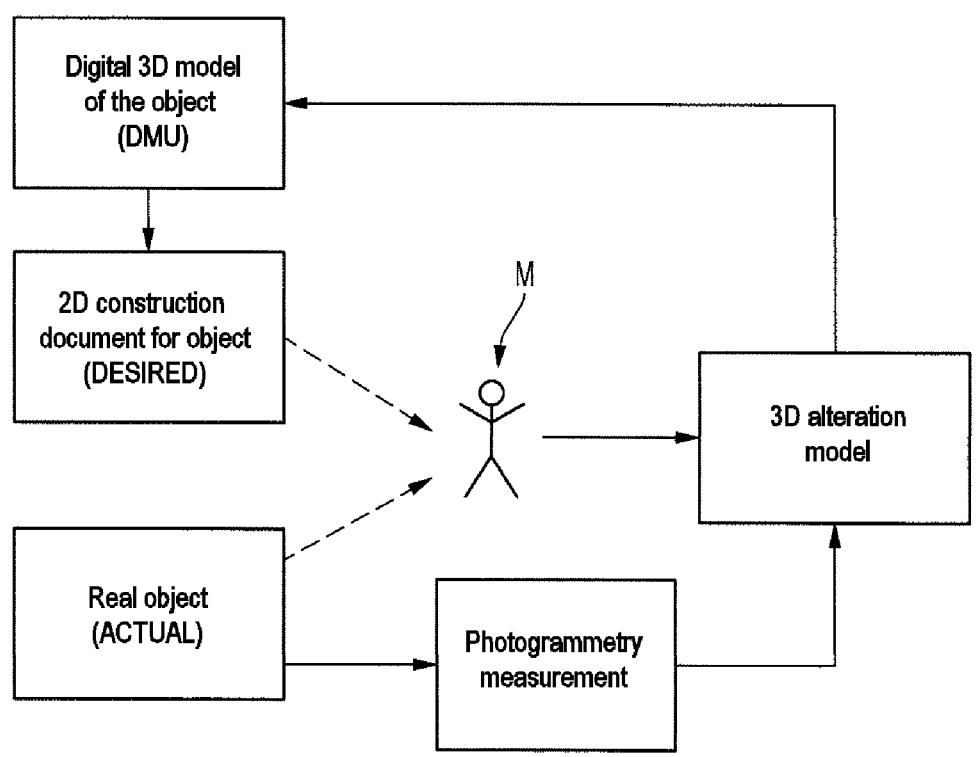
FIG. 2 shows a diagram for illustrating the procedure according to the invention for providing a digital three-dimensional data model of a component.

As can be discerned from FIG. 2, a digital three-dimensional data model DMU of a component is provided in the system and method according to the invention. Said digital three-dimensional data model can be stored in a memory or a database. From the digital three-dimensional data model DMU, construction documents of the object can be derived as desired specifications in a known manner. Said construction documents comprise three-dimensional technical drawings and work instructions, by way of example. Said component is, for example, a line to be laid in an aircraft. Said line can be a pipeline, in which case a hydraulic line, a gas line or a fuel line within the aircraft can be involved. For the case where, on account of the circumstances on site, the line, for example an electrical line or pipeline, can be laid only in a manner deviating from the plan predefined in the construction document, a three-dimensional change data model is generated in the system and method according to the invention. For this purpose, the necessary change made to the respective component, for example the electrical line, is detected or measured by means of photogrammetry for the generation of the digital three-dimensional change data model. Afterwards, the existing or stored digital three-dimensional data model of the component is automatically updated by the generated three-dimensional change data model. As can be discerned from FIG. 2, the three-dimensional data model of the object is updated fully automatically without manual inputting by a development engineer. It furthermore becomes clear from FIG. 2 that there is no media break between two-dimensional change proposals or complaint notifications and the three-dimensional data model in the case of the procedure according to the invention. The risk of erroneous inputs into the three-dimensional model is thereby precluded. The three-dimensional model of the object is immediately updated without delay times, with the result that the three-dimensional data model and the construction documents derived therefrom are not obsolete. The photogrammetry enables a rapid uncomplicated measurement of the actual state at a real object, for example within an aircraft fuselage.

Figure 3:
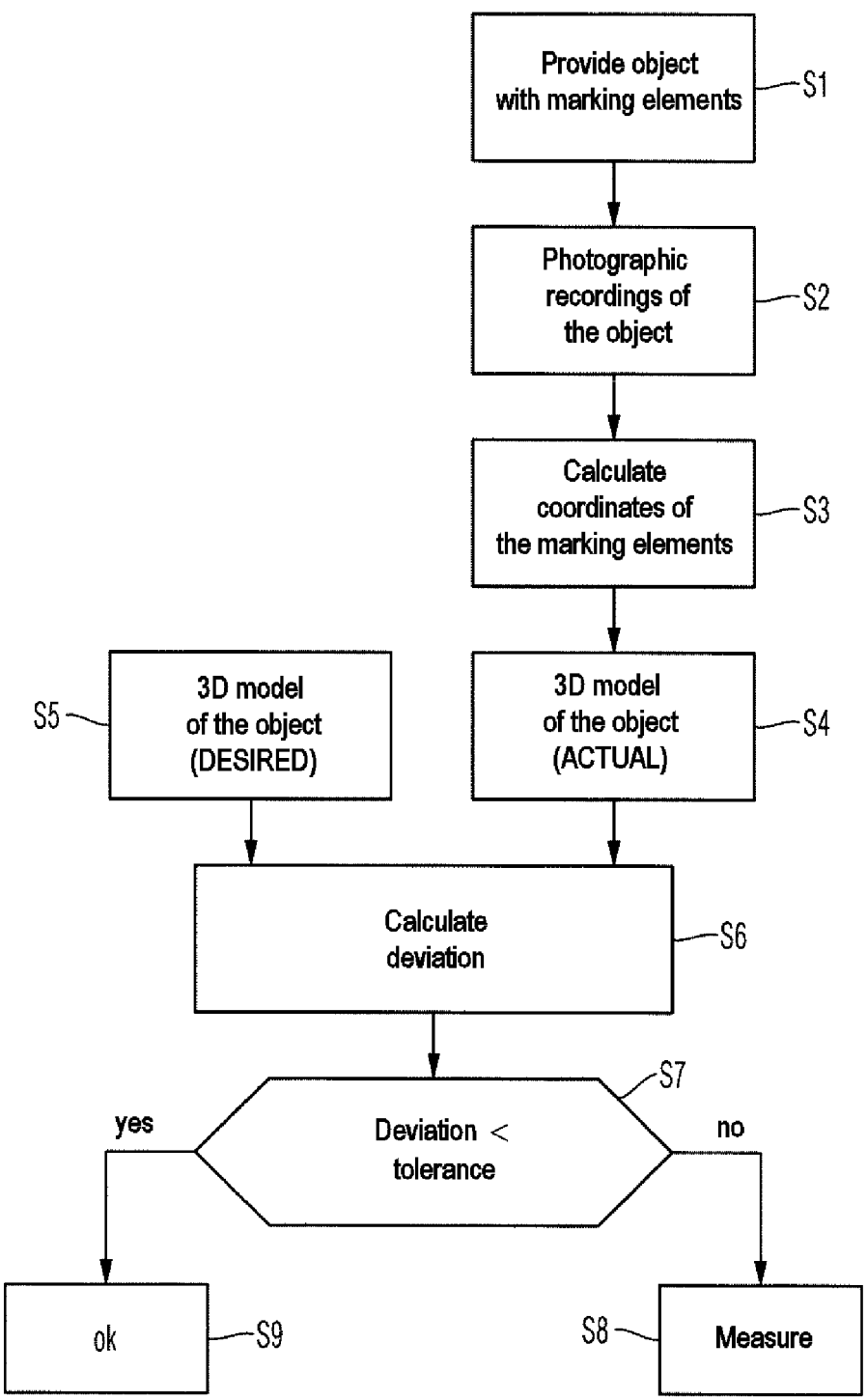
FIG. 3 shows a flowchart for a possible embodiment of the method according to the invention for providing a digital three-dimensional data model of a component.

FIG. 3 shows a flowchart of a possible embodiment of the method according to the invention for providing a digital three-dimensional data model of a component.

In a step S1, firstly each change location of the component at which a change to the component is to be made, or has already been made, is provided with marking elements. Said marking elements have measurement marks, coding marks and reference scales. The optically detectable measurement marks are provided at the component or object to be measured. The measurement marks can be fixed directly to the component or be fitted in direct proximity to the component to be measured. Furthermore, coding marks for linking different digital images and, if appropriate, reference scales for measuring the distances are provided.

After the marking elements have been fitted in the method according to the invention in step S2, the component to be measured is photographically recorded at the respective change location from different viewpoints for the generation of a plurality of digital images. A high-resolution fixed focal length camera that is calibratable is preferably used in this case. This calibratable high-resolution camera having a fixed focal length makes it possible to calculate, for the elements visible in the digital images, in particular the marking elements, the coordinates thereof.

In the method according to the invention in step S3, the coordinates of the marking elements are calculated by a calculation unit, in particular a computer. The measurement marks fitted to the component are automatically extracted from the digital images by means of image recognition and their three-dimensional spatial coordinates are calculated therefrom. Photogrammetry software references the data of all the digital images into a common three-dimensional data system and calculates the coordinates of the marked measurement points.

In a further step S4, the stored digital three-dimensional data model of the entire component is automatically updated by the change data models generated for the change locations.

The current three-dimensional data model updated in accordance with the change model represents the current state or actual state of the component.

In a step S5, the previous three-dimensional data model of the object existing prior to the updating, which model represents the original desired state, can be read out. In a step S6, a deviation between the updated three-dimensional data model and the original three-dimensional data model can be calculated. Consequently, in step S6, the updated digital three-dimensional data model of the entire component is compared with a digital three-dimensional reference data model in order to calculate a model deviation.

In a further step S7, a check can be made to determine whether the model deviation lies within or outside a tolerance range that can be set. If the model deviation lies outside a tolerance range that can be set, a corresponding fault handling measure is initiated and performed in step S8. If the model deviation lies within the tolerance range, a corresponding notification is generated in step S9.

In one possible embodiment, the different generated three-dimensional change data models which are generated at the different change locations are stored together with the associated digital images for the documentation of the respective change in a database.

Figure 4:
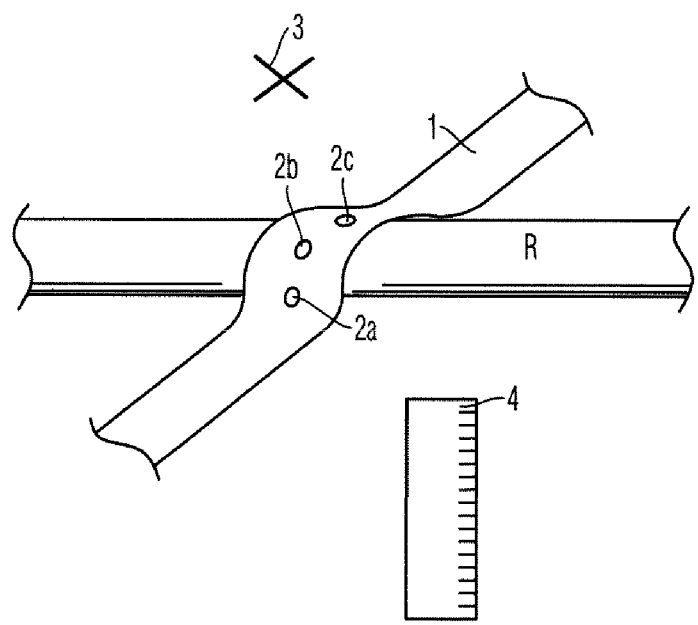
FIG. 4 shows a simple example of an alteration carried out, for elucidating the method according to the invention for providing a data model.

FIG. 4 shows a simple example for elucidating the system and method according to the invention for providing a digital three-dimensional data model for a component, in particular an aircraft component.

During the mounting or laying of the electrical line, a fitter ascertains in this case that an electrical line 1 cannot be laid in accordance with the construction documents since an obstacle in the form of a pipeline R is present. The fitter is therefore forced to lay the electrical line 1 around the pipeline R and thus to deviate from the specification. In order to document this change and to bring about a corresponding change in the digital three-dimensional data model of the corresponding component 1, the fitter provides the object or the component 1 at the change location with marking elements 2. In the example illustrated in FIG. 4, the fitter fits measurement marks 2a, 2b, 2c to the laid electrical line 1. The measurement marks 2 can be stuck onto the sheath of the electrical cable 1, by way of example. Furthermore, a coding mark 3 is fitted to the change location. Said coding mark 3 serves for linking the different digital images that are recorded by the fitter with the aid of a photographic camera 7 from different viewing angles. Furthermore, the fitter can visibly fit a reference scale 4, for example a ruler or the like, to the change location. After these measures have been carried out, the change location is photographed from different viewpoints with the aid of a high-resolution camera 7.

Figure 5:
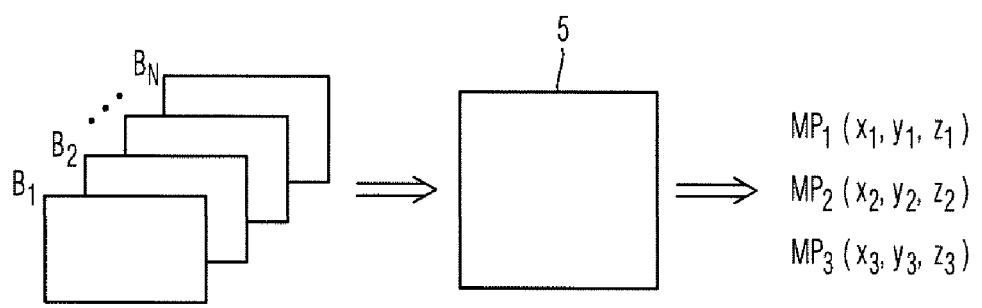
FIG. 5 shows a diagram for illustrating the calculation of spatial coordinates, on the basis of detected measurement marks in the method according to the invention.

FIG. 5 shows different digital images B1 to Bn that are automatically transmitted from the camera 7 to a calculation unit 5, which automatically detects measurement marks 2 provided at the component 1 and calculates therefrom three-dimensional spatial coordinates of the different measurement points 2. On the basis of the calculated spatial coordinates, software can be used to calculate a digital three-dimensional change data model at the respective change location of the component 1.

Figure 6:
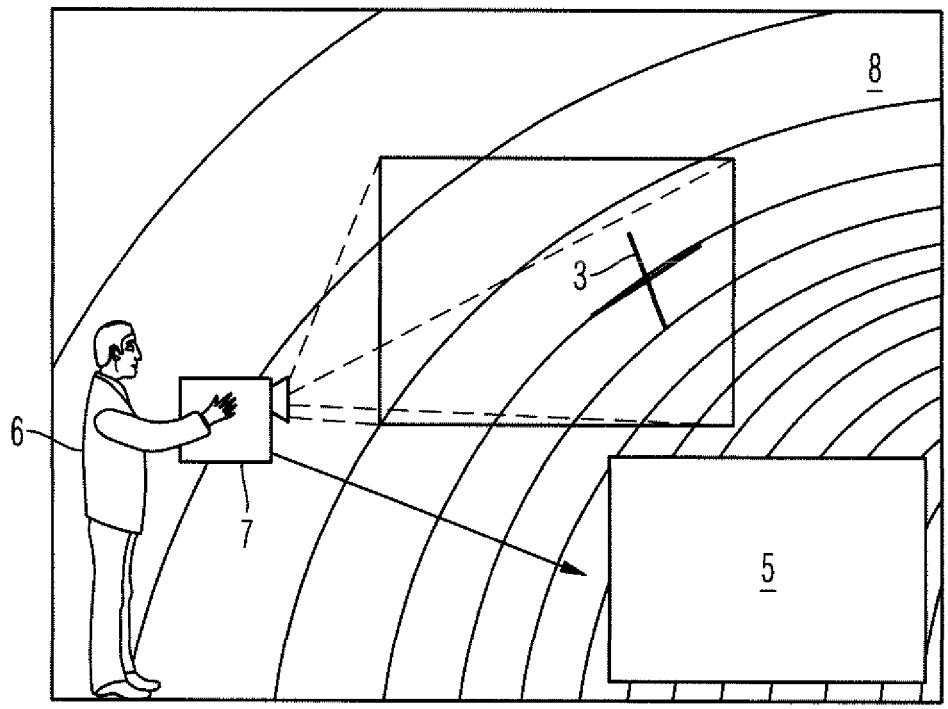
FIG. 6 shows an illustration for elucidating the procedure in the method according to the invention for providing a digital three-dimensional data model.

FIG. 6 shows a fitter 6, who is situated within an aircraft fuselage 8 and, by means of a camera 7, records a plurality of digital images B at a change location and transmits them to a calculation unit 5. The measured points are photographed from different viewpoints in overlapping fashion by means of a high-resolution camera 7. These digital images B can be transmitted for example to a laptop or PC as calculation unit 5, which automatically identifies the measurement marks and calculates the spatial coordinates thereof.

Figure 1:
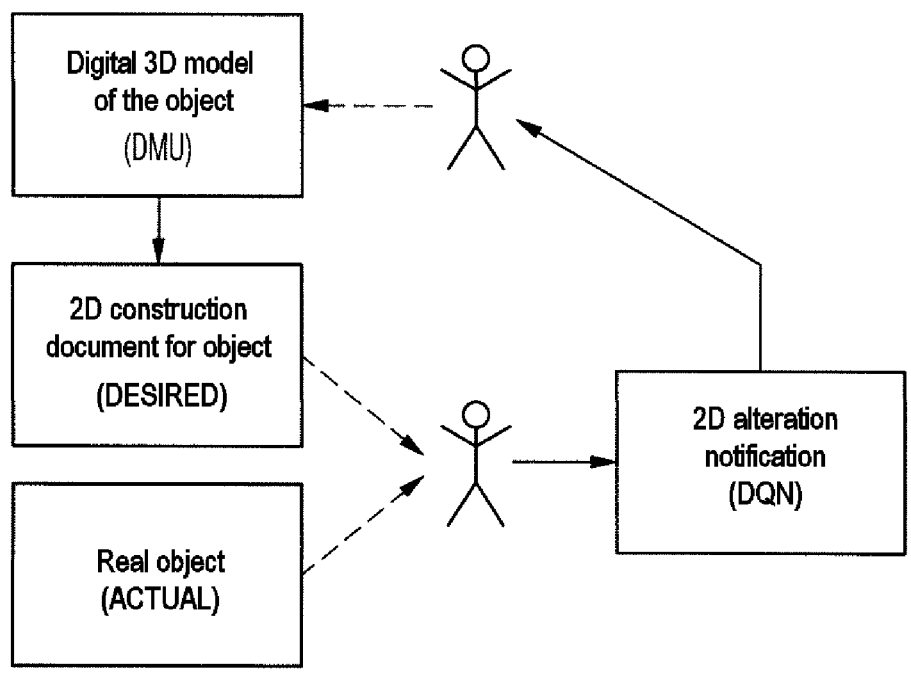
FIG. 1 shows a diagram for illustrating a conventional procedure for providing a digital three-dimensional data model of a component.
Figure 7:
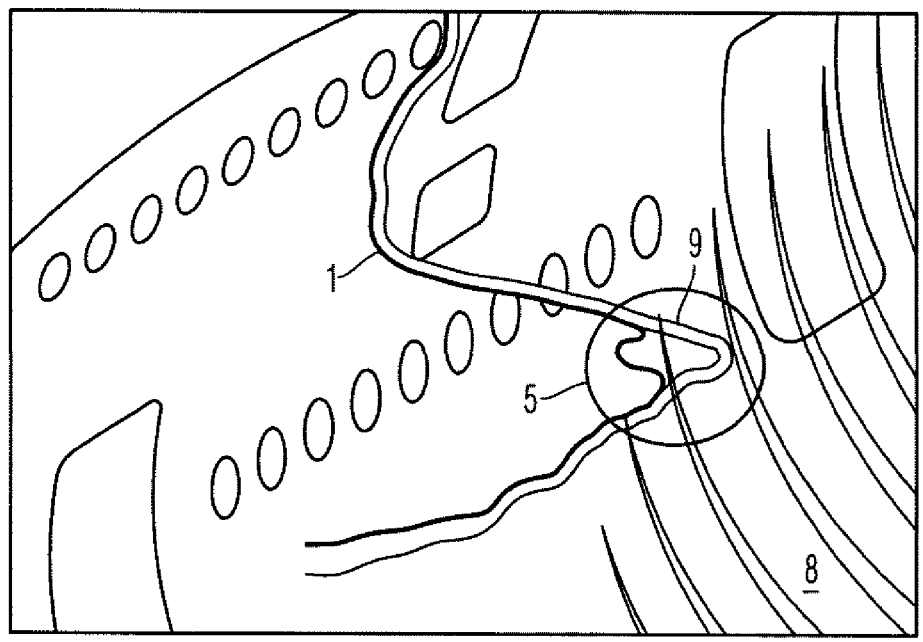
FIG. 7 shows an example of a desired/actual deviation in a digital three-dimensional data model, said deviation being determined by the method according to the invention.

FIG. 7 shows a simple example of a deviation between a digital three-dimensional reference data model and an updated three-dimensional model of an object. In the example illustrated in FIG. 7, a line as component 1 is laid within an aircraft fuselage 8. At a change location S, the laying of the component 1 deviates from the desired course 9 of the reference data model. A current three-dimensional model of the object that is formed from the measured spatial coordinates can thus be compared directly with the associated original design. In the method according to the invention, the required time from the beginning of the measurement of the respective object until a possible comparison result is present is short and amounts to a few minutes to a few hours. In the conventional procedure illustrated in FIG. 1, the required time for incorporating change proposals including enquiries by telephone often amounts to several days and is greatly dependent on the quality of the associated textual descriptions and the photographs present. The procedure according to the invention leads to a comparison result much more quickly. Furthermore, in the procedure according to the invention, the calculation of the model deviation between desired and actual, that is to say between the reference data model and the updated digital three-dimensional data model, can be performed directly. Consequently, there is no risk of incorrect interpretations, since the data model supplied visualizes the spatial coordinates actually implemented in reality. The model deviation can be calculated directly and the corresponding measures can be carried out swiftly.

In the method according to the invention, the photographic measurement of the component can be performed during the installation work. The high-resolution digital photographs that arise during the photographic measurement can be used for documentation purposes in addition to the updating of the digital three-dimensional model. With the method according to the invention, further points can be measured in addition to the explicitly marked measurement points. This means that the stored high-resolution digital images, on account of the reference scales used, can subsequently be used for measuring other points represented on the images, if this becomes necessary. The photographic measurement of change locations that is used in the method according to the invention permits a contactless measurement of components by means of a calibrated camera 7 and further aids such as standardized reference scales 4, in which case, for producing perspective, coding marks 3 are provided in order to relate different digital images B to one another. For measuring and determining three-dimensional spatial coordinates, a plurality of digital images of the object to be measured are recorded in different viewing angles. The software creates from the digital images, the scales and the coding marks mutually referenced three-dimensional spatial coordinates with respect to the marked measurement points.

The present invention provides a method and a system for providing a digital three-dimensional data model of a component. In this case, changes made to the component, for example a line, are detected by means of photogrammetry for the generation of digital three-dimensional change data models. The digital three-dimensional data model of the component is then automatically updated in a manner depending on the generated change data models.

The invention claimed is:

1. A system for providing a digital three-dimensional data model of a component, the system comprising one of a memory and a database, wherein changes made to the component are detected by means of photogrammetry for the generation of digital three-dimensional change data models stored in the one of the memory and the database by which the digital three-dimensional data model of the component is automatically updated.

2. The system according to claim 1,
wherein marking elements are provided at each change location of the component.

3. The system according to claim 2,
wherein at least one photographic camera is provided which photographically records the component provided with marking elements at the respective change location from different points of view in order to generate digital images.

4. The system according to claim 2,
wherein the marking elements have measurement marks, which are fitted or stuck to the component, coding marks for linking the different digital images, and reference scales.

5. The system according to claim 4,
wherein a calculation unit is provided, which automatically detects the measurement marks provided on the component in the recorded digital images and calculates spatial coordinates thereof, and wherein the calculation unit calculates a digital three-dimensional change data model at the respective change location of the component from the calculated spatial coordinates of the detected measurement marks.

6. The system according to claim 5,
wherein provision is made of a memory for storing a digital three-dimensional data model of the entire component, and wherein the calculation unit updates the stored digital three-dimensional data model of the entire component in a manner dependent on the generated change data models.

7. The system according to claim 1,
wherein the component is an aircraft component, pipeline or an electrical line.

8. The system according to claim 7,
wherein the pipeline is a hydraulic line, a gas line or a fuel line.

9. A method for providing a digital three-dimensional data model of a component comprising:
detecting a change made to the component by means of photogrammetry, and generating a digital three-dimensional change data model by which said digital three-dimensional data model of the component is automatically updated.

10. The method according to claim 9,
wherein the component is provided with marking elements at each change location at which a change to the component is made.

11. The method according to claim 10,
wherein the component provided with marking elements is photographically recorded at the respective change location from different points of view in order to generate digital images, and
wherein each generated three-dimensional change data model is stored together with the associated digital images for documentation of the respective change.

12. The method according to claim 11,
wherein the marking elements have measurement marks, which are fitted to the component, coding marks for linking different digital images, and reference scales.

13. The method according to claim 12,
wherein the measurement marks fitted to the component are automatically extracted from the digital images and spatial coordinates thereof are calculated, and wherein a digital three-dimensional change data model at the respective change location of the component is generated from the calculated spatial coordinates of the detected measurement marks.

14. The method according to claim 13,
wherein a stored digital three-dimensional data model of the entire component is automatically updated by the change data models generated for the change locations, and wherein the updated digital three-dimensional data model of the entire component is compared with a digital three-dimensional reference data model for the calculation of a model deviation.

15. The method according to claim 14,
wherein a fault handling measure is carried out if the model deviation lies outside a settable tolerance range.

* * * * *